US012787610B2

(12) United States Patent
Zhang et al.

(10) Patent No.: US 12,787,610 B2
(45) Date of Patent: Nov. 3, 2026

(54) ORGANIC LIGHT-EMITTING DIODES WITH OFF-AXIS UNIFORMITY

(71) Applicant: Apple Inc., Cupertino, CA (US)

(72) Inventors: Yifan Zhang, Palo Alto, CA (US); Amin Salehi, San Jose, CA (US); Chieh-Wei Chen, Taichung (TW); Hoyeon Kim, Campbell, CA (US); Paul S Drzaic, Morgan Hill, CA (US); Yun Liu, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 428 days.

(21) Appl. No.: 18/329,390

(22) Filed: Jun. 5, 2023

(65) Prior Publication Data

US 2024/0040909 A1 Feb. 1, 2024

Related U.S. Application Data

(60) Provisional application No. 63/394,178, filed on Aug. 1, 2022.

(51) Int. Cl.
*H10K 59/80* (2023.01)
*H10K 59/38* (2023.01)

(52) U.S. Cl.
CPC ........... *H10K 59/876* (2023.02); *H10K 59/38* (2023.02); *H10K 59/873* (2023.02)

(58) Field of Classification Search
CPC .... H10K 59/876; H10K 59/38; H10K 59/873; H10K 59/877
See application file for complete search history.

(56) References Cited

U.S. PATENT DOCUMENTS 5,780,174 A * 7/1998 Tokito .................... H05B 33/12 372/98
6,917,159 B2 7/2005 Tyan et al.
7,247,394 B2 7/2007 Hatwar et al.
7,268,485 B2 9/2007 Tyan et al.
8,253,153 B2 8/2012 Shanks
9,583,734 B2 2/2017 Shim et al.
10,096,744 B2 10/2018 Coe-Sullivan et al.
2003/0156239 A1* 8/2003 Inoue ................ G02F 1/133553 349/113
2004/0080476 A1* 4/2004 Tsai ....................... H10K 59/12 345/82
2005/0156519 A1* 7/2005 Yoshizawa ........... H10K 59/871 313/506

(Continued)

*Primary Examiner* — Chad M Dicke
*Assistant Examiner* — Jeremy Daniel Watts
(74) *Attorney, Agent, or Firm* — Treyz Law Group, P.C.; Joseph F. Guihan; Jinie M. Guihan

(57) ABSTRACT

An electronic device may have a display such as an organic light-emitting diode display. The organic light-emitting diode display may have an array of organic light-emitting diode pixels that each have organic light-emitting diode layers interposed between a cathode and an anode. To improve off-axis luminance and luminance uniformity, the display may include green pixels with emission spectra having a narrow full width at half maximum, the display may include a reflective layer that is formed separately from a transparent anode, and/or the display may include a diffusive layer. The diffusive layer may be embedded in one or more encapsulation layers for the display. The diffusive layer may be a diffusive color filter.

20 Claims, 10 Drawing Sheets

(56) References Cited

U.S. PATENT DOCUMENTS

| | | | | |
|---|---|---|---|---|
| 2005/0285114 | A1* | 12/2005 | Kang | H10K 59/805<br>257/72 |
| 2017/0110518 | A1* | 4/2017 | Lee | H10K 59/38 |
| 2018/0090716 | A1* | 3/2018 | Shirahase | H10K 30/865 |
| 2019/0027705 | A1 | 1/2019 | Chen et al. | |
| 2019/0363070 | A1* | 11/2019 | Zhang | H10W 90/00 |
| 2020/0006443 | A1* | 1/2020 | Park | H10K 50/131 |
| 2021/0057670 | A1 | 2/2021 | Wong et al. | |
| 2021/0259076 | A1 | 8/2021 | Petluri et al. | |
| 2022/0181398 | A1* | 6/2022 | Jung | H10K 50/11 |
| 2022/0320474 | A1* | 10/2022 | Shin | H10K 59/8792 |

* cited by examiner

ORGANIC LIGHT-EMITTING DIODES WITH OFF-AXIS UNIFORMITY

This application claims priority to U.S. provisional patent application No. 63/394,178, filed Aug. 1, 2022, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

SUMMARY

A display may include a transparent anode, organic light-emitting diode layers formed over the transparent anode, a cathode formed over the organic light-emitting diode layers, and a reflective layer that is formed underneath the transparent anode and that is electrically isolated from the transparent anode.

A display may include an anode, organic light-emitting diode layers formed over the anode, a cathode formed over the organic light-emitting diode layers, and a diffusive layer that is formed over the cathode and that overlaps the anode.

A display may include an array of pixels. Each pixel may include a reflective anode, organic light-emitting diode layers formed over the reflective anode, and a cathode formed over the organic light-emitting diode layers. The array of pixels may include red pixels, green pixels, and blue pixels. The green pixels may have an emission spectrum that has a full width at half maximum of between 25 nanometers and 50 nanometers.

DETAILED DESCRIPTION

Figure 1:
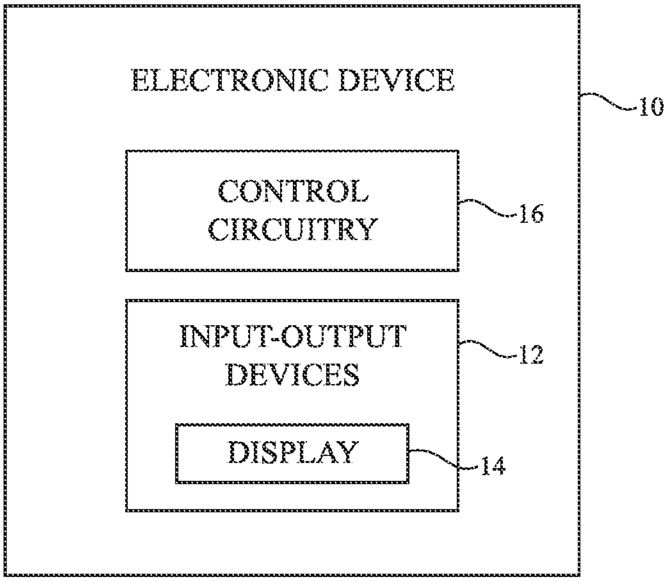
FIG. 1 is a schematic diagram of an illustrative electronic device having a display in accordance with some embodiments.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. The control circuitry may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a liquid crystal display, an organic light-emitting diode display, or any other desired type of display. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
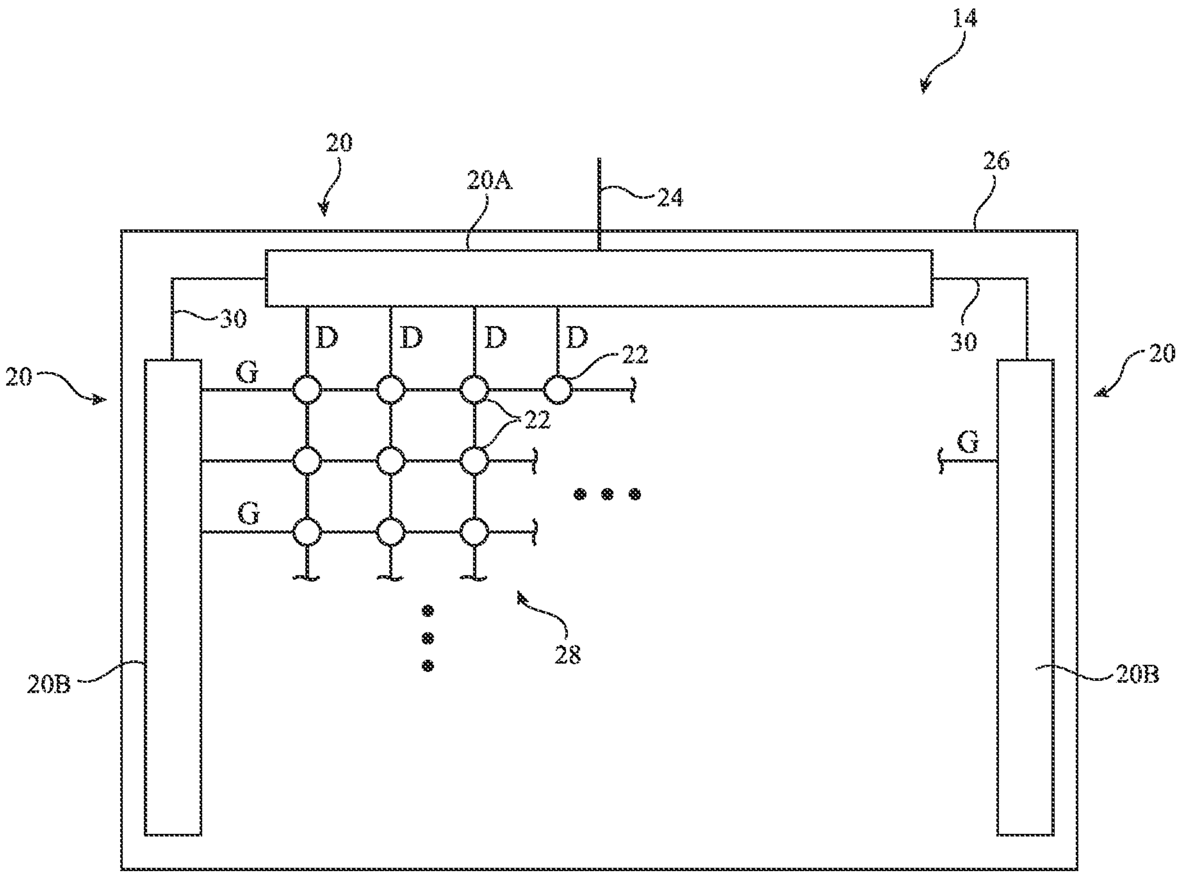
FIG. 2 is a schematic diagram of an illustrative display in accordance with some embodiments.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels.

Display driver circuitry 20 may be used to control the operation of pixels 22. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
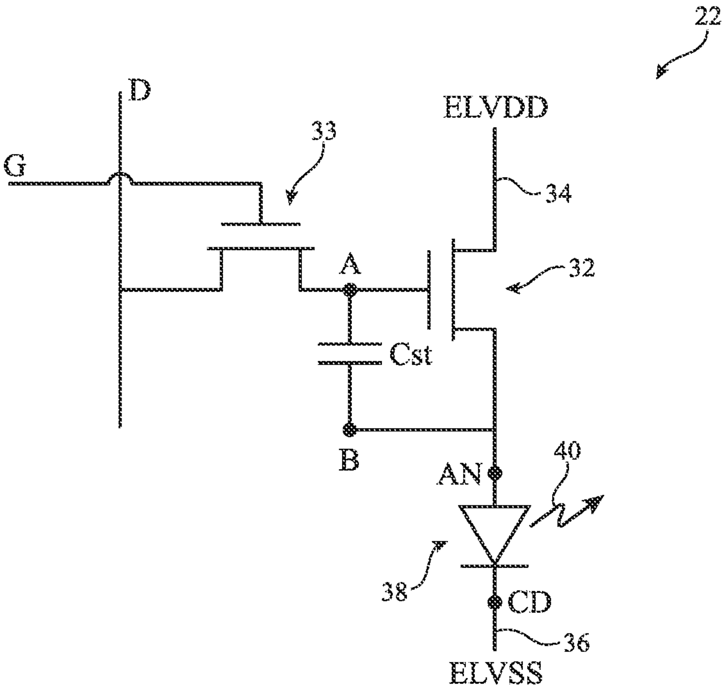
FIG. 3 is a diagram of an illustrative pixel circuit in accordance with some embodiments.

A schematic diagram of an illustrative pixel circuit of the type that may be used for each pixel 22 in array 28 is shown in FIG. 3. As shown in FIG. 3, display pixel 22 may include light-emitting diode 38. A positive power supply voltage ELVDD may be supplied to positive power supply terminal 34 and a ground power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38.

To ensure that transistor 32 is held in a desired state between successive frames of data, display pixel 22 may include a storage capacitor such as storage capacitor Cst. The voltage on storage capacitor Cst is applied to the gate of transistor 32 at node A to control transistor 32. Data can be loaded into storage capacitor Cst using one or more switching transistors such as switching transistor 33. When switching transistor 33 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 33 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38. If desired, the circuitry for controlling the operation of light-emitting diodes for display pixels in display 14 (e.g., transistors, capacitors, etc. in display pixel circuits such as the display pixel circuit of FIG. 3) may be formed using other configurations (e.g., configurations that include circuitry for compensating for threshold voltage variations in drive transistor 32, etc.). The display pixel circuit of FIG. 3 is merely illustrative.

Figure 4:
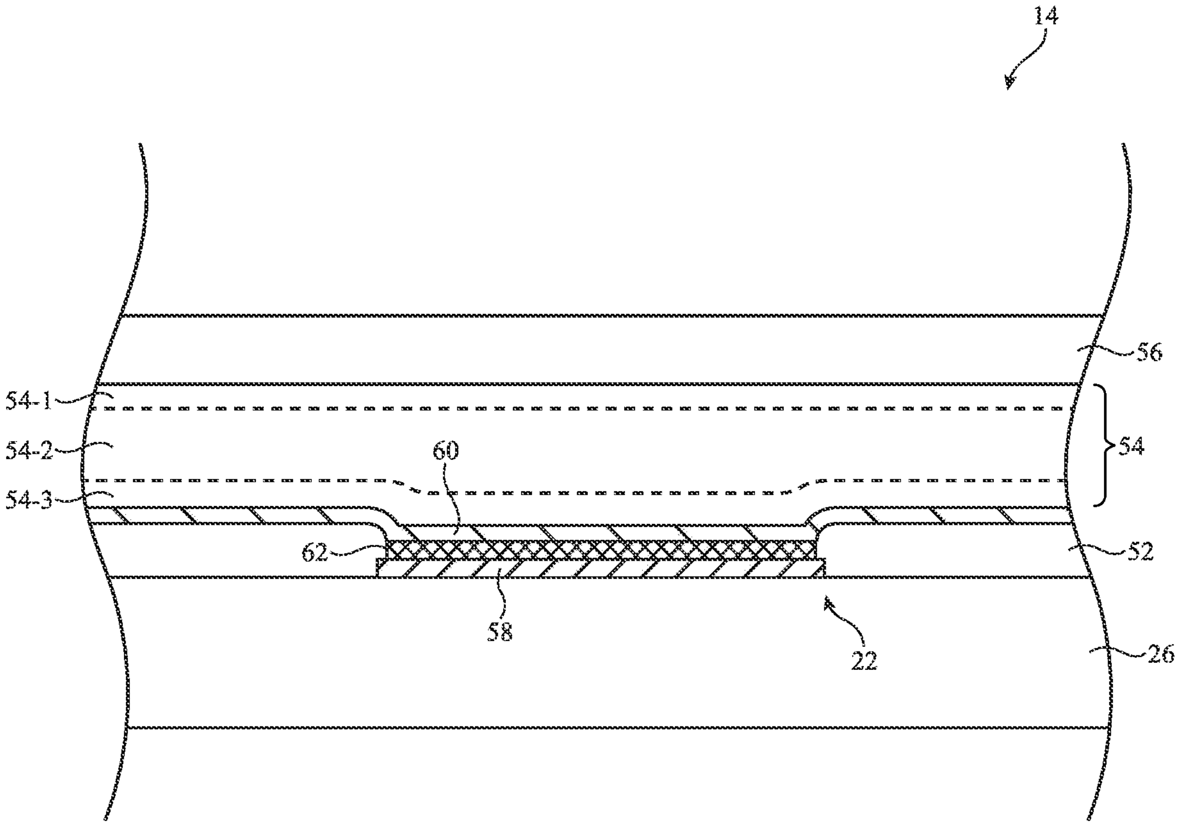
FIG. 4 is a cross-sectional side view of an illustrative display with organic light-emitting diode pixels in accordance with some embodiments.

FIG. 4 is a cross-sectional side view of an illustrative OLED display. As shown in FIG. 4, display 14 may include a substrate layer 26. Substrate layer 26 may be a glass layer, polymer layer, silicon layer, a composite film that includes polymer and inorganic materials, a metallic foil, etc. In one arrangement, substrate layer 26 in FIG. 4 is a dielectric planarization layer. Additional substrate layers may be included below substrate layer 26 depicted in FIG. 4.

A first electrode 58 (sometimes referred to as anode 58), a second electrode 60 (sometimes referred to as cathode 60), and OLED layers 62 are included in display 14 as part of a given pixel 22. Anode 58 (represented by terminal AN in FIG. 3) may be formed from a conductive layer on substrate layer 26. OLED layers 62 are formed over anode 58. Cathode 60 (represented by terminal CD in FIG. 3) is formed over OLED layers 62. OLED layers 62 may include one or more of a hole injection layer, a hole generation layer, an emissive layer, a charge generation layer, an electronic generation layer, and an electron injection layer.

In FIG. 4, cathode 60 is formed as a common cathode across the display. In other words, cathode 60 serves as the cathode for the entire array of pixels 22. Anodes 58, in contrast, are patterned such that there is one electrically discrete anode per pixel. The example of having patterned anodes and a common cathode to form the pixels is merely illustrative. If desired, this arrangement may be inverted such that patterned cathodes and a common anode are used to form the pixels.

Anode 58 may be formed from a highly reflective material such as an aluminum copper (AlCu) alloy, a silver alloy (a combination of silver and at least one other material such as copper, germanium, palladium, etc.), or any other desired conductive material. Each anode 58 may reflect more than 70% of light (e.g., visible light), more than 80% of light, more than 90% of light, more than 95% of light, more than 99% of light, etc.

Cathode layer 60 may be formed from a partially transparent conductive material. In one illustrative example, cathode layer 60 may be formed from a combination of magnesium (Mg) and silver (Ag). Cathode layer 60 may be formed form any other desired conductive material or combination of conductive materials. Cathode 60 may transmit less than 90% of light, may transmit less than 80% of light, may transmit less than 70% of light, may transmit less than 60% of light, may transmit less than 50% of light, may transmit more than 40% of light, may transmit more than 50% of light, may transmit more than 60% of light, may transmit between 40% and 80% of light, may transmit between 45% and 60% of light, may transmit between 60% and 70% of light, may transmit between 50% and 75% of light, etc. Cathode 60 may reflect more than 10% of light, may reflect more than 20% of light, may reflect more than 30% of light, may reflect more than 40% of light, may reflect more than 50% of light, may reflect more than 60% of light, may reflect less than 50% of light, may reflect less than 60% of light, may reflect between 20% and 60% of light, may reflect between 40% and 55% of light, may reflect between 30% and 40% of light, may reflect between 25% and 50% of light, etc.

Cathode layer 60 may optionally be formed from a transparent conductive material having a transmission that is greater than 90%, greater than 95%, greater than 97%, greater than 99%, etc.

The display of FIG. 4 uses an optical cavity to enhance efficiency and color purity in the display. The optical cavity may be formed by reflective layers within the display that are formed on either side of the OLED layers. Reflective anode 58 defines a first boundary for the optical cavity and partially reflective cathode 60 defines a second boundary for the optical cavity. By tuning the thickness of the optical cavity that includes the OLED layers, each pixel may be optimized to have high emission at a desired wavelength.

As shown in FIG. 4, display 14 also includes a pixel definition layer 52, one or more encapsulation layers 54, and a polarizer 56. Pixel definition layer 52 may be formed from a dielectric layer (e.g., a transparent or opaque dielectric layer) that defines apertures through which each pixel 22 emits light. The one or more encapsulation layers 54 may include dielectric layers such as a first inorganic passivation layer 54-1 (formed from an inorganic dielectric material), an organic planarization layer 54-2 (formed from an organic dielectric material), and a second inorganic passivation layer 54-3 (formed from an inorganic dielectric material). Polarizer 56 may be a linear polarizer. The linear polarizer may optionally be formed as part of a circular polarizer. The linear polarizer may help mitigate reflections of ambient light off of display 14.

Display 14 may include some pixels with OLED layers 62 that include green emissive layers that emit green light, some pixels with OLED layers 62 that include red emissive layers that emit red light, and some pixels with OLED layers 62 that include blue emissive layers that emit blue light. Alternatively, display 14 may include common OLED layers 62 across pixel array 28. The tuning of the optical cavity for the pixels and/or color filters may be used to cause each pixel to emit light of a desired color.

In general, it may be desirable for display 14 to have high off-axis luminance and luminance uniformity. However, if care is not taken, at off-axis viewing angles the luminance may lower than desired and there may be perceived luminance non-uniformity.

Figure 5:
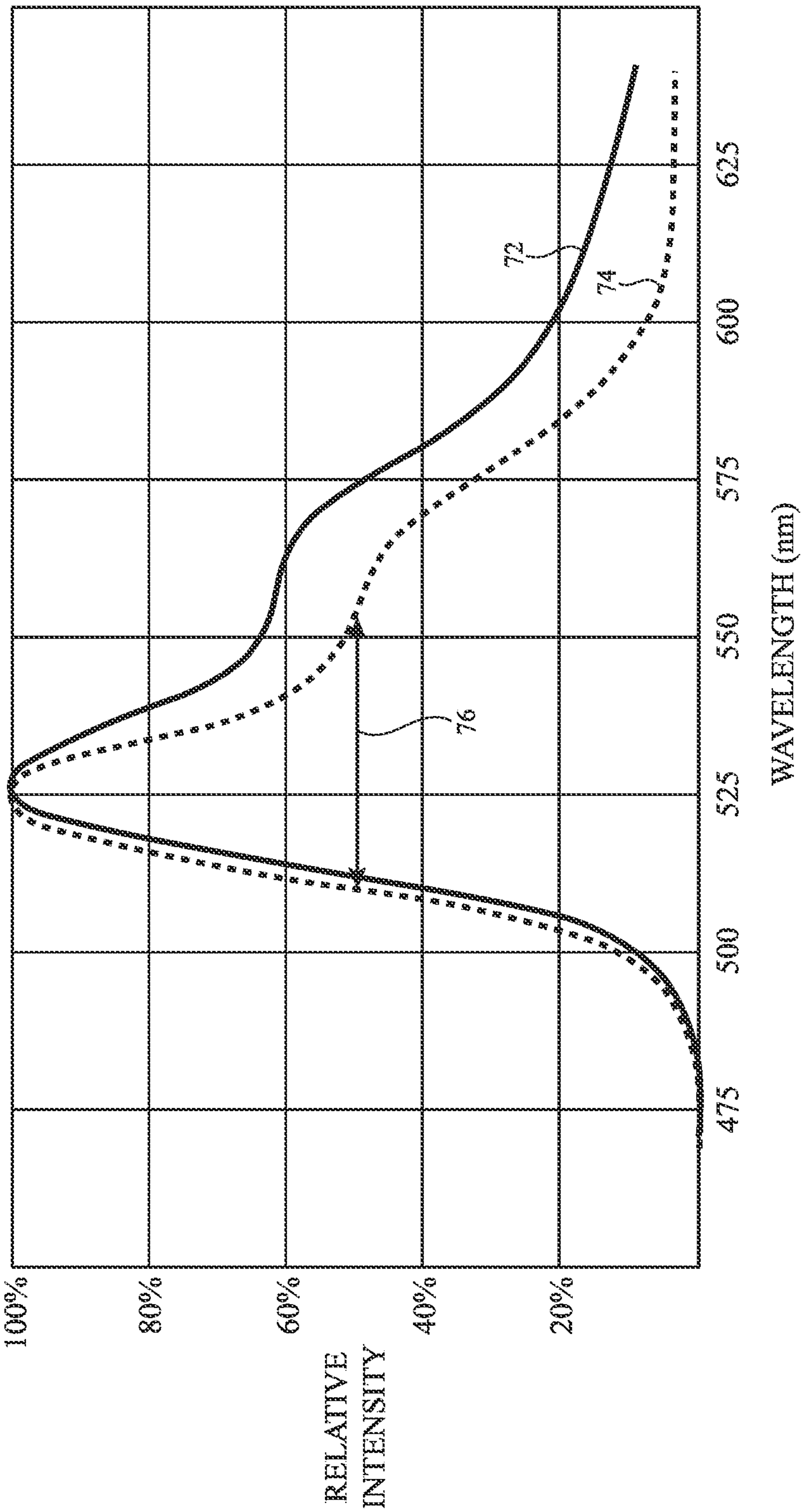
FIG. 5 is a graph showing the emission spectra of green pixels that may be included in an organic light-emitting diode display of the type shown in FIG. 4 in accordance with some embodiments.

To improve off-axis luminance and mitigate perceived display luminance non-uniformity, the green pixels in the display may be tuned to have emission spectra with a narrow full width at half maximum (FWHM). FIG. 5 is a graph of the emission spectra associated with green OLED pixels in display 14. Profile 72 shows the profile for green pixels that use green emissive layers having a wide FWHM. Profile 74 shows the profile for green pixels that use green emissive layers having a narrow FWHM. FWHM refers to the full width of the profile at half of the maximum intensity (e.g., 50% intensity in FIG. 5).

As shown in FIG. 5, profile 74 has a FWHM 76 with a magnitude of approximately 45 nanometers. This example is merely illustrative. In general, FWHM 76 may be less than 75 nanometers, less than 65 nanometers, less than 60 nanometers, less than 55 nanometers, less than 50 nanometers, less than 45 nanometers, less than 40 nanometers, greater than 45 nanometers, greater than 40 nanometers, greater than 25 nanometers, between 25 nanometers and 50 nanometers, between 25 nanometers and 60 nanometers, between 30 nanometers and 50 nanometers, between 35 nanometers and 50 nanometers, between 40 nanometers and 50 nanometers, etc. Using green pixels in display 14 with emission spectra having a narrow FWHM (e.g., less than 50 nanometers) may improve off-axis luminance in the display.

Figure 6:
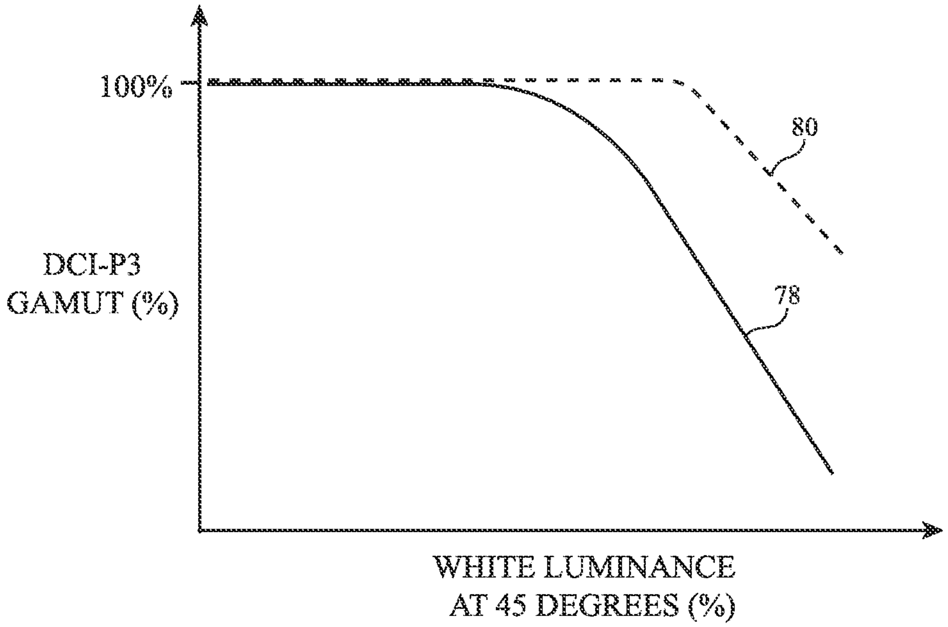
FIG. 6 is a graph of DCI-P3 gamut as a function of white luminance at a 45 degree off-axis viewing angle for displays including the green pixels with the spectra of FIG. 5 in accordance with some embodiments.

FIG. 6 is a graph of DCI-P3 gamut as a function of white luminance at a 45 degree off-axis viewing angle. Profile 78 represents the DCI-P3 gamut as a function of white luminance at a 45 degree off-axis viewing angle for a display that includes green pixels having the emission spectra of profile 72 in FIG. 5. Profile 80 represents the DCI-P3 gamut as a function of white luminance at a 45 degree off-axis viewing angle for a display that includes green pixels having the emission spectra of profile 74 in FIG. 5. As shown in FIG. 6, profile 80 maintains full DCI-P3 gamut coverage at a greater off-axis luminance than profile 78. A display using green pixels having the emission spectra of profile 74 in FIG. 5 therefore has improved off-axis luminance and luminance uniformity compared to a display using green pixels having the emission spectra of profile 72 in FIG. 5. The thicknesses of the functional layers for the red, green, and blue pixels in display 14 may also be optimized for further improvements in off-axis luminance and luminance uniformity.

Figure 7:
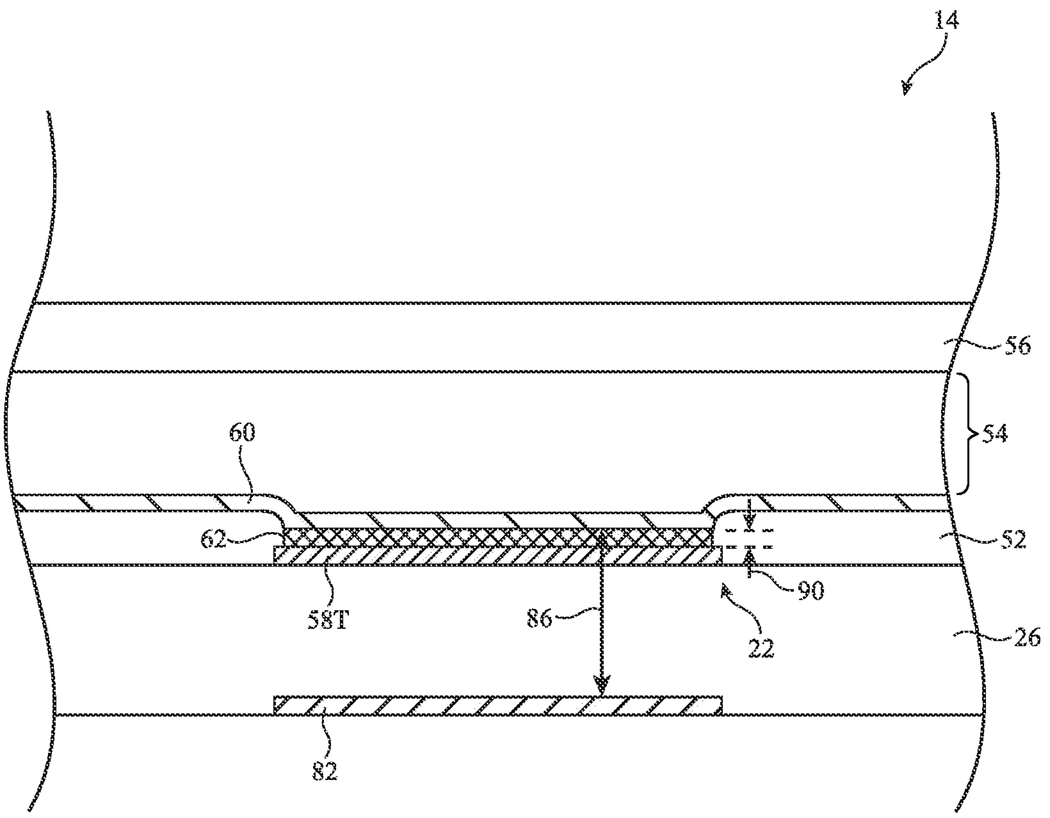
FIG. 7 is a cross-sectional side view of an illustrative display with organic light-emitting diode pixels that include a transparent anode and a planar reflective layer in accordance with some embodiments.

In FIG. 4, anode 58 serves both an electrical function (by applying an anode voltage to the OLED layers 62) and an optical function (by serving as a reflective boundary for an optical cavity). This example is merely illustrative. If desired, the anode may instead be a transparent anode that serves the electrical function but not the optical function. A reflective layer may be included in addition to the transparent anode to define a boundary for the optical cavity for the pixel. FIG. 7 is cross-sectional side view of a display having an arrangement of this type.

In FIG. 7, anode 58T is formed from a transparent conductive layer. Anode 58T may have a reflectivity of less than 20%, less than 10%, less than 5%, less than 3%, less than 1%, etc. Anode 58T may have a transparency of greater than 80%, greater than 90%, greater than 95%, greater than 97%, greater than 99%, etc. A conductive via through substrate 26 may electrically connect anode 58T to an anode voltage. Therefore, transparent anode 58T applies an anode voltage to OLED layers 62.

Reflective layer 82 is included beneath transparent anode 58T. Reflective layer 82 may be formed from a highly reflective material such as an aluminum copper (AlCu) alloy, a silver alloy (a combination of silver and at least one other material such as copper, germanium, palladium, etc.), or any other desired material. Reflective layer 82 may be formed form a conductive material or a dielectric material. Reflective layer 82 may reflect more than 70% of light (e.g., visible light), more than 80% of light, more than 90% of light, more than 95% of light, more than 99% of light, etc.

Anode 58T and cathode 60 may be separated by a distance 90. Distance 90 may be less than 0.5 microns, less than 0.4 microns, less than 0.3 microns, less than 0.2 microns, less than 0.1 micron, etc. Reflective layer 82 is separated from cathode 60 by a distance 86. Distance 86 may be greater than 0.5 microns, greater than 1 micron, greater than 1.5 microns, greater than 2 microns, less than 2.5 microns, less than 2 microns, between 0.5 microns and 2.5 microns, between 1 micron and 2 microns, etc. Distance 86 is the thickness of the optical cavity for pixel 22. The thickness of the optical cavity in FIG. 7 (distance 86) is greater than the thickness of the optical cavity in FIG. 4 (distance 90). The increased thickness of the optical cavity may weaken the cavity strength, thereby increasing luminance at off-axis viewing angles.

Distance 86 may be at least 50% greater than distance 90, at least 100% greater than distance 90, at least 200% greater than distance 90, at least 300% greater than distance 90, at least 400% greater than distance 90, at least 500% greater than distance 90, etc.

In FIG. 7, reflective layer 82 is electrically isolated from transparent anode 58T (e.g., the reflective layer 82 is not shorted to the transparent anode 58T). Reflective layer 82 may be conductive or non-conductive in FIG. 7. When reflective layer 82 is electrically isolated from transparent anode 58T, reflective layer 82 may be floating or may be grounded. In another possible arrangement, a via through substrate layer 26 may electrically connect transparent anode 58T to reflective layer 82 (and reflective layer 82 is formed from a conductive material).

Figure 8:
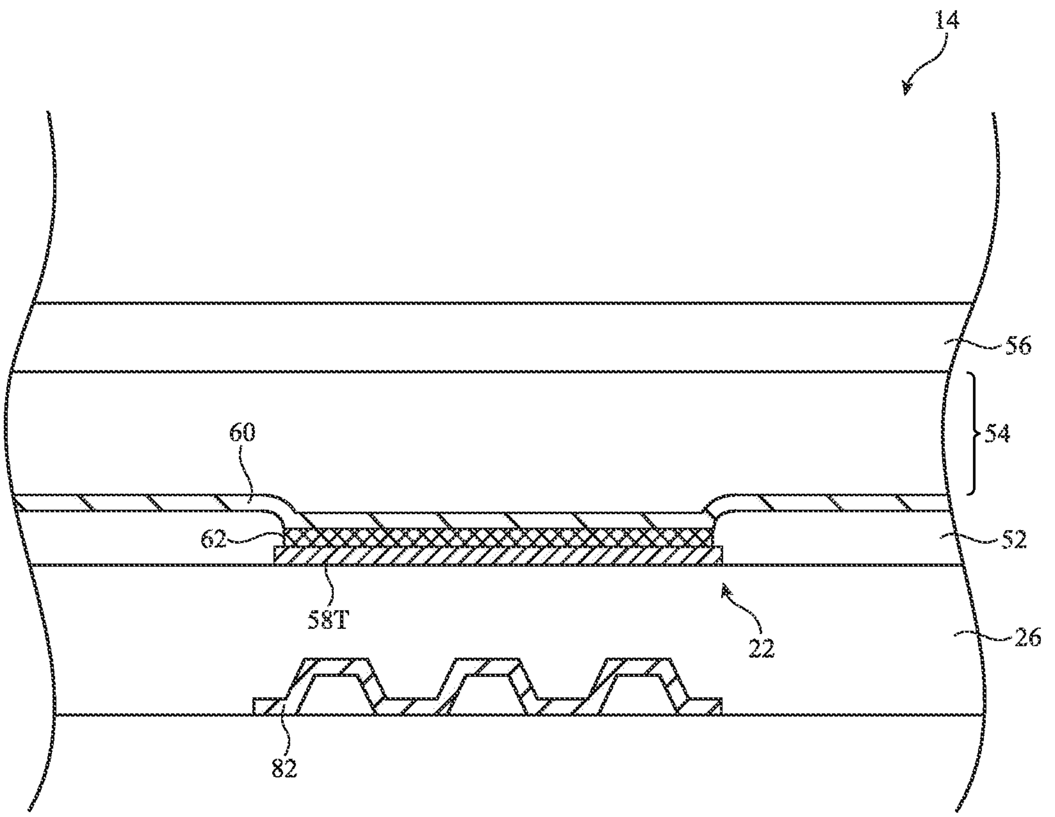
FIG. 8 is a cross-sectional side view of an illustrative display with organic light-emitting diode pixels that include a transparent anode and a non-planar reflective layer in accordance with some embodiments.

In FIG. 7, reflective layer 82 has a planar upper surface. This example is merely illustrative. In another possible arrangement, shown in FIG. 8, reflective layer 82 may have a non-planar upper surface. In FIG. 8, reflective layer 82 has a corrugated upper surface with alternating ridges and grooves. The non-planar upper surface may have periodic or non-periodic ridges and grooves. The non-planar upper surface of each reflective layer 82 may have the same shape for all of the pixels in the display. Alternatively, all of the green pixels in the display may have reflective layers with non-planar upper surfaces of a first shape, all of the red pixels in the display may have reflective layers with non-planar upper surfaces of a second shape that is different than the first shape, and all of the blue pixels in the display may have reflective layers with non-planar upper surfaces of a third shape that is different than the first and second shapes. In other words, the shape of the upper surface of the reflective layer may be optimized for each color of pixel.

Figure 9:
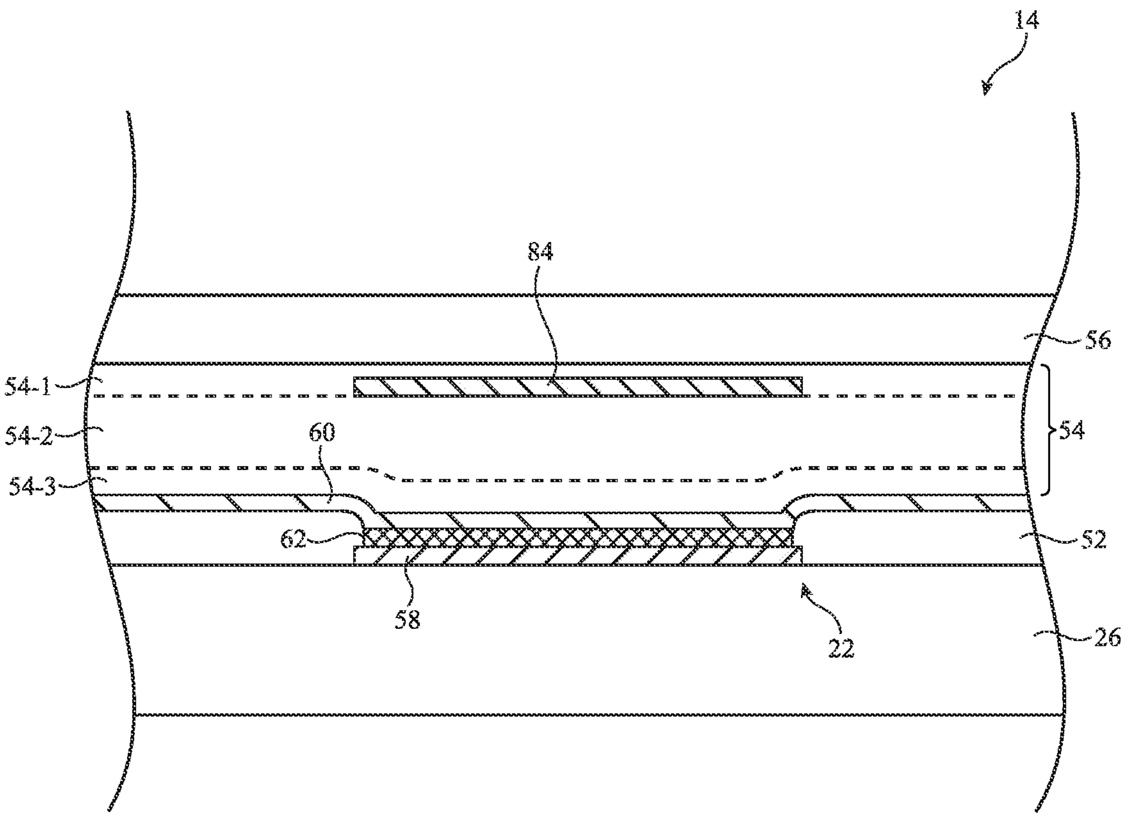
FIG. 9 is a cross-sectional side view of an illustrative display with organic light-emitting diode pixels that include diffusers in accordance with some embodiments.

In FIGS. 4, 7, and 8, encapsulation layers 54 and polarizer 56 are not diffusive. To improve off-axis luminance and luminance uniformity, a diffusive layer may be incorporated above each pixel 22. FIG. 9 is a cross-sectional side view of a display with a diffusive layer over each pixel. As shown in FIG. 9, diffuser 84 is formed over anode 58 for pixel 22. Diffuser 84 may improve out-coupling efficiency as well as increase off-axis luminance.

Diffuser 84 may be formed by scattering particles embedded in a transparent host material (e.g., polymer) or may have another desired arrangement. In FIG. 9, diffuser 84 is incorporated between inorganic passivation layer 54-1 and organic planarization layer 54-2. This example is merely illustrative. Diffuser 84 may instead be formed between cathode 60 and inorganic passivation layer 54-3, between inorganic passivation layer 54-3 and organic planarization layer 54-2, between inorganic passivation layer 54-1 and polarizer 56, or at any other desired location within display 14 that overlaps OLED layers 62.

Diffuser 84 may be characterized by a haze. Haze may be measured as the percentage of incident light scattered by more than 2.5 degrees through the diffuser. The haze of diffuser 84 may be greater than 5%, greater than 10%, greater than 20%, greater than 30%, greater than 40%, greater than 50%, greater than 60%, etc.

In FIG. 9, each pixel includes a respective discrete diffuser 84. Alternatively, a blanket diffuser layer may be formed over all of the display (that covers both the footprints of the pixels and the footprint of non-pixel area between the pixels).

In FIG. 9, diffuser 84 does not substantially change the color of light that passes through the diffuser. In another possible arrangement, shown in FIG. 10, a diffusive color filter 84CF is incorporated over each pixel 22. Diffusive color filter 84CF may include scattering particles embedded in a color filtering material, may include a first layer with scattering particles embedded in a transparent host material (e.g., polymer) and a second layer that includes color filtering material, or may have another desired arrangement. The haze of diffusive color filter 84CF may be greater than 5%, greater than 10%, greater than 20%, greater than 30%, greater than 40%, greater than 50%, greater than 60%, etc.

Figure 10:
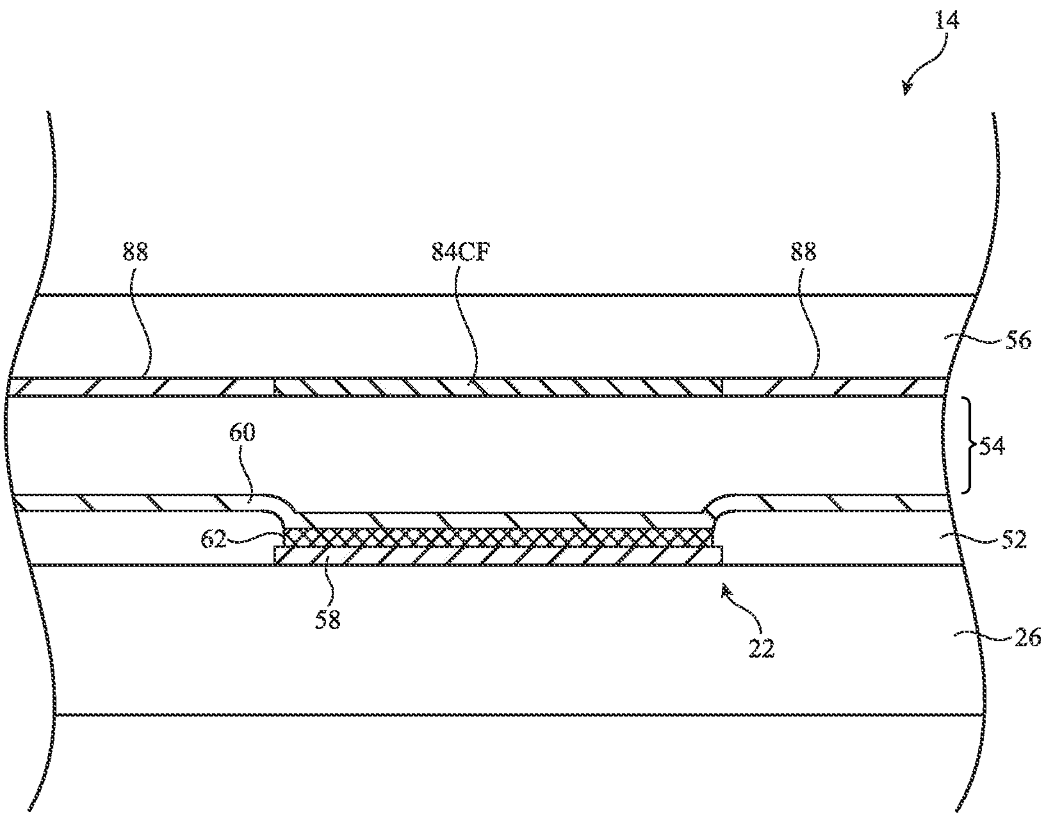
FIG. 10 is a cross-sectional side view of an illustrative display with organic light-emitting diode pixels that include diffusive color filters in accordance with some embodiments.

As shown in FIG. 10, the diffusive color filter 84CF may be formed on an upper surface of encapsulation layers 54. This example is merely illustrative. Diffusive color filter 84CF may instead be formed between inorganic passivation layer 54-1 and organic planarization layer 54-2, between cathode 60 and inorganic passivation layer 54-3, between inorganic passivation layer 54-3 and organic planarization layer 54-2, or at any other desired location within display 14 that overlaps OLED layers 62.

In FIG. 10, the diffusive color filter 84CF is surrounded by an opaque masking layer 88 (sometimes referred to as black masking layer 88). The opaque masking layer may mitigate ambient light reflection in display 14. This example is merely illustrative. The black masking layer 88 may optionally be omitted if desired.

Although only one pixel is explicitly shown in FIGS. 4 and 7-10, it should be understood that every pixel in pixel array 28 may have the same arrangement as shown in FIGS. 4 and 7-10.

The techniques described herein to improve off-axis luminance and luminance uniformity may be included in a single display if desired. For example, a single display may have one or more of: green pixels with emission spectra having a narrow FWHM (as in FIG. 5), a reflective layer that is formed separately from a transparent anode (as in FIG. 7 or FIG. 8), and a diffusive layer (as in FIG. 9 or FIG. 10).

The foregoing is merely illustrative and various modifications can be made by those skilled in the art without departing from the scope and spirit of the described embodiments. The foregoing embodiments may be implemented individually or in any combination.

What is claimed is:

1. A display having a plurality of pixels that emit light in a direction, the display comprising:
- a transparent anode;
- organic light-emitting diode layers formed over the transparent anode;
- a cathode formed over the organic light-emitting diode layers;
- a reflective layer that is formed underneath the transparent anode;
- a substrate that is interposed between the transparent anode and the reflective layer, wherein the substrate electrically isolates the transparent anode from the reflective layer; and
- a diffuser formed over the transparent anode, wherein the diffuser is a blanket layer that overlaps the plurality of pixels in the direction.

2. The display defined in claim 1, wherein the reflective layer and the cathode define an optical cavity for an organic light-emitting diode pixel that includes the transparent anode.

3. The display defined in claim 1, wherein the cathode has a transparency between 40% and 80%, wherein the reflective layer has a reflectivity greater than 80%, and wherein the transparent anode has a transparency greater than 80%.

4. The display defined in claim 1, wherein the reflective layer comprises a dielectric material.

5. The display defined in claim 1, wherein the reflective layer and the cathode are separated by a distance that is between 1 micron and 2 microns and wherein the transparent anode and the cathode are separated by a distance that is less than 0.4 microns.

6. The display defined in claim 1, wherein the substrate comprises a planarization layer.

7. The display defined in claim 1, wherein the reflective layer has a planar upper surface.

8. The display defined in claim 1, wherein the reflective layer has a non-planar upper surface.

9. The display defined in claim 8, wherein the non-planar upper surface has periodic ridges and grooves.

10. The display defined in claim 8, wherein the non-planar upper surface has non-periodic ridges and grooves.

11. The display defined in claim 1, wherein the organic light-emitting diode layers emit green light with an emission spectrum that has a full width at half maximum (FWHM) of less than 50 nanometers.

12. The display defined in claim 1, wherein the diffuser covers footprints of pixels of the plurality of pixels and a footprint of a non-pixel area between the pixels of the plurality of pixels.

13. The display defined in claim 1, wherein the plurality of pixels comprises:
- a plurality of red pixels;
- a plurality of blue pixels; and
- a plurality of green pixels, wherein each pixel in the plurality of red pixels, the plurality of blue pixels, and the plurality of green pixels includes a respective transparent anode and a respective reflective layer formed underneath the respective transparent anode, wherein the reflective layers for the plurality of red pixels have upper surfaces with a first shape, wherein the reflective layers for the plurality of blue pixels have upper surfaces with a second shape that is different from the first shape, and wherein the reflective layers for the plurality of green pixels have upper surfaces with a third shape that is different from the first and second shapes.

14. A display comprising:
- an anode;
- organic light-emitting diode layers formed over the anode;
- a cathode formed over the organic light-emitting diode layers; and
- a diffusive layer that is formed over the cathode and that overlaps the anode, wherein the diffusive layer does not substantially change a color of light that passes through the diffusive layer.

15. The display defined in claim 14, further comprising:
- at least one encapsulation layer that overlaps the cathode, wherein the diffusive layer is embedded in the at least one encapsulation layer or wherein the diffusive layer is formed on an upper surface of the at least one encapsulation layer.

16. The display defined in claim 15, wherein the at least one encapsulation layer comprises a first inorganic passivation layer, an organic planarization layer, and a second inorganic passivation layer, wherein the organic planarization layer is interposed between the first and second inorganic passivation layers, and wherein the diffusive layer is interposed between the first inorganic passivation layer and the organic planarization layer.

17. The display defined in claim 14, wherein the diffusive layer has a haze that is greater than 20%.

18. The display defined in claim 14, wherein the diffusive layer has a haze that is greater than 30%.

19. A display comprising:

an anode;

organic light-emitting diode layers formed over the anode;

a cathode formed over the organic light-emitting diode layers;

a diffuser formed over the cathode and overlapping the anode, wherein the diffuser does not substantially change a color of light that passes through the diffuser;

first and second inorganic passivation layers formed over the cathode and overlapping the anode, wherein the second inorganic passivation layer is interposed between the first inorganic passivation layer and the cathode; and an organic planarization layer interposed between the first and second inorganic passivation layers, wherein the diffuser is embedded in the first inorganic passivation layer.

20. The display defined in claim 19, wherein the diffuser is in direct contact with the organic planarization layer.

* * * * *